United States Patent [19]

Ikeya et al.

[11] Patent Number: 4,710,796
[45] Date of Patent: Dec. 1, 1987

[54] RESIN ENCAPSULATION TYPE SEMICONDUCTOR DEVICE BY USE OF EPOXY RESIN COMPOSITION

[75] Inventors: Hirotoshi Ikeya, Yokosuka; Michiya Higashi, Kawasaki, both of Japan

[73] Assignee: Kabushiki Kaisha Toshiba, Japan

[21] Appl. No.: 739,920

[22] Filed: May 31, 1985

[30] Foreign Application Priority Data

Aug. 23, 1984 [JP] Japan ................... 59-174148

[51] Int. Cl.⁴ .......................................... H01L 23/28
[52] U.S. Cl. ...................... 357/72; 523/460
[58] Field of Search ............... 357/72; 264/272.13, 264/272.17; 523/400, 460, 513; 174/52 PE, 110 SR; 528/89; 428/76, 451

[56] References Cited

U.S. PATENT DOCUMENTS

| | | | |
|---|---|---|---|
| 4,248,920 | 2/1981 | Yoshizumi et al. | 357/72 X |
| 4,282,136 | 8/1981 | Hunt et al. | 523/460 |
| 4,328,150 | 5/1982 | Kondow et al. | 528/89 X |
| 4,572,853 | 2/1986 | Ikeya et al. | 357/40 X |

FOREIGN PATENT DOCUMENTS 56-129245 10/1981 Japan .
58-75854 5/1983 Japan ................... 357/72
58-96755 6/1983 Japan ................... 357/72
59-48943 3/1984 Japan ................... 357/72

Primary Examiner—Andrew J. James
Assistant Examiner—Sara W. Crane
Attorney, Agent, or Firm—Schwartz, Jeffery, Schwaab, Mack, Blumenthal & Evans

[57] ABSTRACT

A resin encapsulation type semiconductor device having a semiconductor element and a resinous encapsulating material for encapsulating said semiconductor element therein, said resinous encapsulating material comprising a cured product of an epoxy resin composition for encapsulation of semiconductor, comprising:

(a) 100 parts by weight of an epoxy resin;
(b) 5 to 500 parts by weight of a curing agent having at least two phenolic hydroxyl groups in one molecule;
(c) 0.01 to 20 parts by weight of an organic phosphine compound; and
(d) 0.1 to 100 parts by weight of at least one antimony oxide selected from the group consisting of diantimony tetroxide, hexaantimony tridecaoxide and diantimony pentoxide high reliability in terms of thermal cycle resistance, humidity resistance and the like.

12 Claims, 1 Drawing Figure

RESIN ENCAPSULATION TYPE SEMICONDUCTOR DEVICE BY USE OF EPOXY RESIN COMPOSITION

BACKGROUND OF THE INVENTION

This invention relates to a resin encapsulation type semiconductor device by use of an epoxy resin composition, more particularly to a resin encapsulation type semiconductor device by use of an epoxy resin composition which can give a cured product of high reliability.

Epoxy resin compositions have frequently been used for encapsulation of semiconductor elements or electrical circuits in integrated circuit (IC), large scale integrated circuits (LSI), transistor, etc., or other parts.

For epoxy resin composition to be used for such parts of high performance, high reliability is increasingly demanded as the semiconductor devices of today are enlarged in scale and increased in density. Particularly, among high reliabilities, improvement of thermal cycle resistance has been strongly desired.

To explain about the thermal cycle resistance as mentioned here, an epoxy resin composition for encapsulation should never give damages to the parts encapsulated therein depending on the temperature change in the environment. The extent of difficulty in giving such damages is evaluated as the thermal cycle resistance.

To illustrate in detail by referring to an example of a resin encapsulation type semiconductor device, as shown in FIG. 1, 1 is a semiconductor element, which semiconductor element 1 is mounted on a bed 2. The electrode portions (pad portions) of the above semiconductor element 1 are connected with a pluralilty of bonding wires 3, and the other ends of these wires are connected to the lead pin 4.

And, the above semiconductor element 1, the bed 2, the wire 3 and some parts of the lead pin 4 are encapsualted with a resinous encapsulating material 5. Accordingly, these encapsulated parts are subject to mechanical stress by the resinous encapsulating material 5. Due to difference in coefficient of thermal expansion between the resinous encapsulating material 5 and the parts encapsulated therein, when the resin encapsulation type semiconductor device is exposed repeatedly to high temperature and low temperature, it can no longer stand the stress due to difference in coefficient of thermal expansion, until the bonding wires 3 may disadvantageously be broken or cause poor contact.

As the epoxy resin composition for encapsulation, a composition comprising an epoxy resin, a curing agent, an amine type curing accelerator such as imidazole, a halide and antimony trioxide has been proposed. The composition according to this proposal lacks humidity resistant reliability, because it gives damages such as aluminum electrode corrosion to the parts encapsulated therein, and is unsuitable particularly for encapsulation of parts of high performance such as LSI.

Japanese Patent Publication No. 60779/1982 discloses an epoxy resin composition for encapsulation of semiconductor devices, comprising an epoxy resin, a curing agent, an organic phosphine curing accelerator, a halide and antimony trioxide. The composition according to this disclosure has enhanced humidity resistant reliability to a great extent by use of an organic phosphine curing accelerator in place of an amine type curing accelerator such as imidazole. However, with respect to various characteristics other than humidity resistant reliability, the thermal cycle resistance proved to be insufficient.

Japanese Patent Publication No. 32506/1982 discloses a flame retardant epoxy resin composition comprising an epoxy resin, a curing agent, an imidazole curing accelerator and diantimony tetroxide and hexaantimony tridecaoxide. The composition according to this disclosure is intended to improve humidity resistant reliability by formulation of diantimony tetroxide and hexaantimony tridecaoxide in the conventional composition containing imidazole curing accelerator. However, as apparently seen from the fact that no significant difference can be exhibited with respect to the thermal cycle resistance in the respective compositions obtained by formulating diantimony trioxide and diantimony tetroxide, respectively, with imidazole curing accelerator, such a composition failed to give no improvement of the thermal cycle resistance at all.

Japanese Patent Publication No. 33125/1984 discloses an epoxy resin composition for encapsulation of semiconductor devices, comprising an epoxy resin, a curing agent, an organic phosphine curing accelerator, a halide and antimony trioxide. Although, in the specification, the above antimony trioxide is not described clearly as antimony trioxide but is described merely as an antimony oxide, the term "an antimony oxide" used herein is believed to surely mean antimony trioxide, as is apparent to the skilled in the art. The composition according to this disclosure also did not show sufficient thermal cycle resistance.

SUMMARY OF THE INVENTION

An object of the present invention is to overcome the problems mentioned above, and in particilar, to provide a resin encapsulation type semiconductor device by use of an epoxy resin composition that can give a cured product having reliability, such as high thermal cycle resistance.

The present inventors have made extensive studies in order to accomplish the above object and consequently found that the cured product obtained from an epoxy resin composition containing an organic phosphine compound in combination with at least one selected from diantimony tetroxide, hexaantimony tridecaoxide and diantimony pentoxide as the components to be formulated has high reliability such as thermal cycle resistance, to accomplish the present invention.

More specifically, the resin encapsulation type semiconductor device prepared using an epoxy resin composition of the present invention comprises a semiconductor element and a resinous encapsulating material for encapsulating said semiconductor element therein, said resinous encapsulating material comprising a cured product of an epoxy resin composition, comprising:
  (a) 100 parts by weight of an epoxy resin;
  (b) 5 to 500 parts by weight of a curing agent having at least two phenolic hydroxyl groups in one molecule;
  (c) 0.01 to 20 parts by weight of an organic phosphine compound; and
  (d) 0.1 to 100 parts by weight of at least one antimony oxide selected from the group consisting of diantimony tetroxide, hexaantimony tridecaoxide and diantimony pentoxide.

DESCRIPTION OF THE PREFERRED EMBODIMENTS

Figure 1:
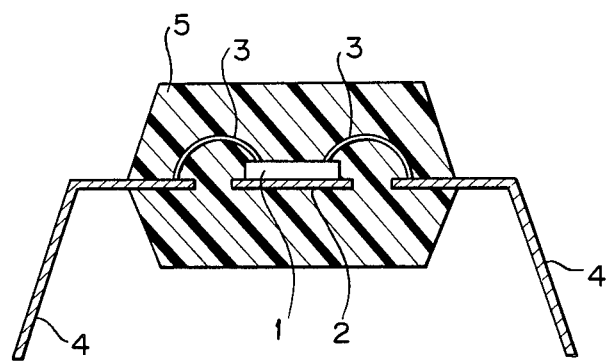
FIG. 1 is a sectional views of a resin encapsulation type semiconductor device. In the FIG. 1, numeral 1 is a semiconductor element, numeral 2 is a bed, numeral 3 is a bonding wire, numeral 4 is a lead pin and numeral 5 is a resinous encapsulating material.

The epoxy resin to be used in the present invention is not particularly limited, but inclusive of those conventionally known in the art. For example, there may be employed epoxy resins having two or more epoxy groups in one molecule, including glycidyl ether type epoxy resins such as bisphenol A type epoxy resins, phenol novolac type epoxy resins, cresol novolac type epoxy resins and the like; glycidylester type epoxy resins; glycidylamine type epoxy resins; linear aliphatic epoxy resins; alicyclic epoxy resins; heterocyclic epoxy resins; halogenated epoxy resins, etc. And, these epoxy resins may be used either singly or as a mixture of two or more resins.

More preferably, the epoxy resin to be used in the present invention is a novolac type epoxy resin having an epoxy equivalent of 170 to 300, as exemplified by phenol novolac type epoxy resin, cresol novolac type epoxy resin, halogenated phenol novolac type epoxy resin, etc. These epoxy resins should desirably have a chlorine ion content of 10 ppm or less and a hydrolyzable chlorine content of 0.1 wt. % or less. This is because the aluminum electrodes of the semiconductor element encapsulated therein will readily be corroded if chlorine ion in excess of 10 ppm or hydrolyzable chlorine in excess of 0.1 wt. % is contained.

The curing agent having two or more phenolic hydroxyl groups in one molecule to be used in the present invention refers to phenol resin, polyhydroxystyrene, phenol aralkyl resin and polyhydric phenol compound, as exemplified specifically by novolac type phenol resins such as phenol novolac resin, cresol novolac resin, tert-butylphenol novolac resin, nonylphenol novolac resin and the like; resol type phenol resins; polyhydroxystyrene such as poly-p-hydroxystyrene; phenol aralkyl resin such as Xylok (trade name, available from Albright & Wilson Ltd.); bisphenol A; and halogenated products of these compounds. Among them, a novolac type phenol resin, polyhydroxystyrene and phenol aralkyl resin are most preferred. Also, these curing agents may be used either singly or in a mixture of two or more compounds.

The curing agent (b) is formulated at a level generally of 5 to 500 parts by weight, preferably of 20 to 100 parts by weight based on 100 parts by weight of the epoxy resin. If the level is less than 5 parts by weight or in excess of 500 parts by weight, the characteristics of the cured product will become undesirably unsatisfactory. Also, the above levels of the epoxy resin (a) and the curing agent (b) to be formulated should be such that the ratio of the phenolic hydroxyl groups in the curing agent to the epoxy groups in the epoxy resin (phenolic hydroxyl groups/epoxy groups) should be generally within the range of from 0.5 to 1.5, preferably from 0.7 to 1.3. If this ratio comes outside the range as specified above, the reaction cannot proceed sufficiently, whereby the characteristics of the cured product will be susceptible to deterioration.

The organic phosphine compound to be used in the present invention is represented by the formula:

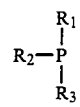

wherein $R_1$ to $R_3$ may be either identical or different, and each represents a hyrogen atom, an aliphatic group, a substituted aliphatic group, an aromatic group or a substituted aromatic group, with proviso that all of the groups $R_1$ to $R_3$ cannot be hydrogen atoms at the same time.

Examples of such organic phosphine compounds may include, for example, triphenylphosphine, tritolylphosphine, tributylphosphine, tricyclohexylphosphine, methyldiphenylphosphine, butylphenylphosphine, diphenylphosphine, phenylphosphine, octylphosphine, tris(p-methylphenyl)phosphine, tris(m-methylphenyl)phosphine, p-boromophenyldiphenylphosphine, tris(cyanoethyl)phosphine, and the like. Also, either of the above $R_1$ to $R_3$ may be an organic group containing an organic phosphine. For example, 1,2-bis(diphenylphosphino)ethane, bis(diphenylphosphino)methane may be employed. Among them, an arylphosphine compound is preferred, particularly triphenylphosphine, tritolylphosphine, 1,2-bis(diphenylphosphino)ethane, bis(diphenylphosphino)methane are most preferred. And these organic phosphine compounds may be used either singly or in a mixture of two or more compounds.

The organic phosphine compound (c) is formulated at a level generally of 0.01 to 20 parts by weight, preferably of 0.01 to 5 parts by weight based on 100 parts by weight of the epoxy resin. If the level is less than 0.01 part by weight, the curing speed is slow, while a level over 20 parts by weight will undesirably result in deterioration of the characteristics of the cured product.

The antimony oxide to be used in the present invention is at least one selected from the group consisting of diantimony tetroxide, hexaantimony tridecaoxide and diantimony pentoxide (including hydrates). Hereinafter, the term "antimony oxide" used in the present specification means ones as defined herein, excluding diantimony trioxide.

The antimony oxide is formulated at a level generally of 0.1 to 100 parts by weight, preferably of 0.5 to 30 parts by weight based on 100 parts of the epoxy resin. If the level is less than 0.1 part by weight, the effect of the addition can be recognized with difficulty, while a level in excess of 100 parts by weight will undesirably result in deterioration of the characteristics of the cured product.

The composition used in the present invention can also use a halide in combination with the above antimony oxide, if desired. The halide may be, for example, bromides such as brominated epoxy resin, brominated curing agent and hexabromobenzene.

It is also possible to add various additives such as inorganic fillers, mold release agents, etc. in the epoxy resin composition used in the present invention, if desired.

The inorganic fillers may include those generally known in the art such as fused silica, crystalline silica, glass fiber, talc, alumina, calcium silicate, calcium carbonate, barium sulfate, magnesia, etc. Among them, for high purity and low thermal expandability, fused silica and crystalline silica are most preferred. When other inorganic fillers are to be used, these silicas should also preferably be used. The amount of the inorganic filler formulated may preferably be about 1.5 to 4-fold of the total weight of the epoxy resin and the curing agent. It is also possible to incorporate, as desired, other additives, for example, mold release agents such as natural waxes, synthetic waxes, metal salts of straight fatty acid, acid amides, esters or paraffins, or surface treating agents such as silane coupling agents, colorants, e.g., carbon black.

As the general method for preparing the epoxy resin composition for encapsulation used in the present invention, starting material components selected to a predetermined composition may be mixed thoroughly by, for example, a mixer, further subjected to melted mixing treatment by means of hot rolls or mixing treatment by means of a kneader, whereby an epoxy resin molding material can easily be obtained.

The resin encapsulation type semiconductor device of the present invention can easily be produced by encapsulating a semiconductor device with the use of the epoxy resin composition for encapsulation as described above. The most general encapsulation method may be, for example, the low pressure transfer molding method, but encapsulation by way of injection molding, compression molding or casting may also be possible.

The epoxy resin composition for encapsulation can be cured by heating on encapsulation to finally obtain a resin capsulation type semiconductor device encapsulated with a cured product of the resulting composition. The semiconductor device as mentioned in the present invention is not particularly limited, including integrated circuit, large scale integrated circuit, transistor, thyristor, diode, etc.

The present invention is described in more detail by referring to the following Examples and Comparative examples.

EXAMPLES 1-4

There were employed, as the epoxy resin a cresol novolac type epoxy resin having an epoxy equivalent of 220 (epoxy resin A) and a brominated epoxy novolac resin having an epoxy equivalent of 290 (epoxy resin B), as the curing agent a phenol novolac resin curing agent having a molecular weight of 800, as the organic phosphine-compound triphenylphosphine, as the antimony oxide diantimony tetroxide, hexaanmitony tridecaoxide, diantimony pentoxide and hydrous diantimony pentoxide (4 hydrates). Further, by selecting fused silica powder, carnauba wax, carbon black, silane coupling agent ($\gamma$-glycidoxypropyltrimethoxysilane) to the compositions (parts by weight) as shown in Table 1, the respective compositions were mixed by a mixer, kneaded by heated rolls to obtain the epoxy resin compositions for encapsulation of semiconductor used in the present invention.

By transfer molding by use of the compositions obtained, MOS type integrated circuits were resin encapsulated. Encapsulation was performed by molding the molding material heated to 90° C. by a high-frequency pre-heater at 170° C. for 2 minutes and further after-curing at 180° C. for 4 hours.

COMPARATIVE EXAMPLES 1-6

In place of diantimony pentoxide and hydrous diantimony pentoxide used in Examples 1-4, diantimony trioxide and 2-methylimidazole were empoyed, otherwise employing the same components as in Examples 1-4 (as shown in Table 1) and following the same procedure to obtain compositions for comparative purpose.

By use of the compositions obtained, resin encapsulation was performed similarly as in Examples 1-4 to prepare test samples for comparative purpose.

TABLE 1

|  | Example | | | | Comparative example | | | | | |
|---|---|---|---|---|---|---|---|---|---|---|
|  | 1 | 2 | 3 | 4 | 1 | 2 | 3 | 4 | 5 | 6 |
| Epoxy resin A | 180 | 180 | 180 | 180 | 180 | 180 | 180 | 180 | 180 | 180 |
| Epoxy resin B | 20 | 20 | 20 | 20 | 20 | 20 | 20 | 20 | 20 | 20 |
| Phenol resin | 90 | 90 | 90 | 90 | 90 | 90 | 90 | 90 | 90 | 90 |
| Triphenyl phosphine | 4 | 4 | 4 | 4 | 4 | — | — | — | 4 | — |
| Diantimony tetroxide | 20 | — | — | — | — | 20 | — | — | — | — |
| Hexaantimony tridecaoxide | — | 20 | — | — | — | — | 20 | — | — | — |
| Diantimony pentoxide | — | — | 20 | — | — | — | — | — | — | — |
| Hydrous diantimony pentoxide | — | — | — | 20 | — | — | — | — | — | — |
| Diantimony trioxide | — | — | — | — | 20 | — | — | 20 | — | — |
| 2-Methylimidazole | — | — | — | — | — | 4 | 4 | 4 | — | 4 |
| Fused silica powder | 700 | 700 | 700 | 700 | 700 | 700 | 700 | 700 | 700 | 700 |
| Carnauba wax | 4 | 4 | 4 | 4 | 4 | 4 | 4 | 4 | 4 | 4 |
| Carbon black | 4 | 4 | 4 | 4 | 4 | 4 | 4 | 4 | 4 | 4 |
| Silane coupling agent | 2 | 2 | 2 | 2 | 2 | 2 | 2 | 2 | 2 | 2 |

By use of the samples obtained, the respective tests for evaluation of the thermal cycle resistance (Evaluation test 1) and humidity resistance (Evaluation test 2) were conducted.

Evaluation test 1 (thermal cycle resistance)

Two thermostatic chambers of +200° C. and −65° C. were prepared, and the above resin encapsulation type semiconductor devices were placed in the thermostatic chamber of +200° C. in number of 100 samples for each device and left to stand for 30 minutes. Then, the samples were taken out and left to stand at room temperature for 5 minutes, followed by leaving to stand in the thermostatic chamber of −65° C. for 30 minutes. Then, the samples were taken out and again left to stand at room temperature for 5 minutes. With the operations as just described being as one cycle, the thermal cycle test was practiced continuously. With lapse of the thermal cycle test, the cycles were intermitted as desired for examination of occurrence of failure by measurement of the characteristics of the resin encapsulated type semiconductor device by means of a tester. The results are shown in Table 2.

TABLE 2

| Thermal cycle test: Accumulative failure rate (%) | | | | | |
|---|---|---|---|---|---|
| | Cycle number | | | | |
| | 50 | 100 | 150 | 200 | 250 |
| Example 1 | 0 | 0 | 0 | 0 | 1 |
| Example 2 | 0 | 0 | 0 | 0 | 3 |
| Example 3 | 0 | 0 | 0 | 0 | 2 |
| Example 4 | 0 | 0 | 0 | 0 | 2 |
| Comparative example 1 | 7 | 92 | 100 | — | — |
| Comparative example 2 | 3 | 87 | 100 | — | — |
| Comparative example 3 | 6 | 84 | 100 | — | — |
| Comparative example 4 | 1 | 77 | 100 | — | — |
| Comparative example 5 | 0 | 0 | 0 | 3 | 12 |
| Comparative example 6 | 2 | 83 | 100 | — | — |

As for thermal cycle resistance, as shown in Evaluation test 1, the system of combination comprising an organic phosphine curing accelerator with diantimony tetroxide, hexaantimony tridecaoxide or diantimony pentoxide exhibits improvement of characteristics to a great extent as compared with the system in which an organic phosphine curing accelerator is combined with diantimony trioxide.

On the other hand, when an imidazole curing accelerator is employed, there is substantially no difference when the system combined with diantimony tetroxide and hexaantimony tridecaoxide, etc. is compared with the system combined with diantimony trioxide.

Therefore, the effect of the present invention can clearly be obtained only when an organic phosphine curing accelerator is combined with diantimony tetroxide, hexaantimony tridecaoxide or diantimony pentoxide.

Evaluation test 2 (Humidity resistance)

Next, for evaluation of humidity resistance reliability, the test of examination about failure due to corrosion of aluminum wiring in the semiconductor device (bias-PCT) was conducted by application of 10 V on the resin encapsulation type semiconductor device in steam at 121° C., 2 atm., and the results are shown in Table 3. The test samples were 100 for each case.

TABLE 3

| Bias-PCT: Accumulative failure rate (%) | | | | | |
|---|---|---|---|---|---|
| | Time | | | | |
| | 50 | 100 | 150 | 200 | 250 |
| Example 1 | 0 | 0 | 0 | 0 | 3 |
| Example 2 | 0 | 0 | 0 | 0 | 7 |
| Example 3 | 0 | 0 | 0 | 0 | 5 |
| Example 4 | 0 | 0 | 0 | 0 | 6 |
| Comparative example 1 | 0 | 0 | 0 | 0 | 0 |
| Comparative example 2 | 68 | 100 | — | — | — |
| Comparative example 3 | 72 | 100 | — | — | — |
| Comparative example 4 | 85 | 100 | — | — | — |

TABLE 3-continued

| Bias-PCT: Accumulative failure rate (%) | | | | | |
|---|---|---|---|---|---|
| | Time | | | | |
| | 50 | 100 | 150 | 200 | 250 |
| Comparative example 5 | 0 | 0 | 17 | 68 | 100 |
| Comparative example 6 | 21 | 100 | — | — | — |

As for humidity resistance reliability, as shown in Evaluation test 2, the system employing an organic phosphine curing accelerator is superior to the system employing an imidazole curing accelerator. Substantially no difference can be seen when the system combining an organic phosphine curing accelerator with diantimony tetroxide, hexaantimony tridecaoxide and diantimony pentoxide is compared with the system combining an organic phosphine curing accelerator with diantimony trioxide.

When similar comparison is made with the system combined with an imidazole curing accelerator, because of low level of the humidity resistance reliability, it is difficult to judge the difference between diantimony tetroxide, hexaantimony tridecaoxide and diantimony trioxide.

Thus, the system according to the combination of the invention has been found to exhibit high level of humidity resistance reliability.

As described in detail above, the epoxy resin composition for encapsulation of semiconductor which is used in the resin encapsulation type semiconductor device according to the present invention can give a cured product having high reliability, and the device of the present invention encapsulated with the use of this composition has also the same characteristics, and their industrial values are great.

We claim:

1. A resin encapsulation type semiconductor device having a semiconductor element and a resinous encapsulating material for encapsulating said semiconductor element therein, said resinous encapsulating material comprising a cured product of an epoxy resin composition for encapsulation of semiconductor, comprising:
   (a) 100 parts by weight of an epoxy resin;
   (b) 5 to 500 parts by weight of a curing agent having at least two phenolic hydroxyl groups in one molecule;
   (c) 0.01 to 20 parts by weight of an organic phosphine compound; and
   (d) 0.1 to 100 parts by weight of at least one antimony oxide selected from the group consisting of diantimony tetroxide, hexaantimony tridecaoxide and diantimony pentoxide.

2. The resin encapsulation type semiconductor device according to claim 1, wherein the epoxy resin is a novolac type epoxy resin having an epoxy equivalent of 170 to 300.

3. The resin encapsulation type semiconductor device according to claim 1, wherein the epoxy resin has a chlorine ion content of 10 ppm or less and a hydrolyzable chlorine content of 0.1% by weight or less.

4. The resin encapsulation type semiconductor device according to claim 1, wherein the curing agent is one selected from the group consisting of a phenol resin, polyhydroxystyrene and a phenol aralkyl resin.

5. The resin encapsulation type semiconductor device according to claim 4, wherein the curing agent is a novolac type phenol resin.

6. The resin encapsulation type semiconductor device according to claim 1, wherein the ratio of the phenolic hydroxyl groups in the curing agent to the epoxy groups in the epoxy resin is within the range of from 0.5 to 1.5.

7. The resin encapsulation type semiconductor device according to claim 1, wherein the organic phosphine compound is an arylphosphine selected from the group consisting of triphenylphosphine, tritolylphosphine, 1,2-bis(diphenylphosphino)ethane and bis(diphenylphosphino) methane.

8. The resin encapsulation type semiconductor device according to claim 7, wherein the organic phosphine compound is triphenylphosphine.

9. The resin encapsulation type semiconductor device according to claim 1, wherein the organic phosphine compound is formulated at a level of 0.01 to 5 parts by weight.

10. The resin encapsulation type semiconductor device according to claim 1, wherein the antimony oxide is formulated at a level of 0.5 to 30 parts by weight.

11. The resin encapsulation type semiconductor device according to claim 1, further containing a halogen compound.

12. The resin encapsulation type semiconductor device according to claim 1, further containing fused silica and/or crystalline silica.

* * * * *